（12） United States Patent
Shin

(10) Patent No.: US 9,094,023 B2
(45) Date of Patent: Jul. 28, 2015

(54) FRACTIONAL-N PHASE LOCKED LOOP, OPERATION METHOD THEREOF, AND DEVICES HAVING THE SAME

(75) Inventor: Jong Shin Shin, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 843 days.

(21) Appl. No.: 13/228,520

(22) Filed: Sep. 9, 2011

(65) Prior Publication Data

US 2012/0063521 A1 Mar. 15, 2012

(30) Foreign Application Priority Data

Sep. 9, 2010 (KR) ........................ 10-2010-0088202

(51) Int. Cl.
| H03D 3/24 | (2006.01) |
|---|---|
| H03L 7/081 | (2006.01) |
| H03L 7/18 | (2006.01) |
| H03L 7/099 | (2006.01) |
| H03L 7/197 | (2006.01) |
| H04L 27/00 | (2006.01) |

(52) U.S. Cl.
CPC ........ H03L 7/081 (2013.01); H03L 7/18 (2013.01); H03L 7/0996 (2013.01); H03L 7/1974 (2013.01); H04L 27/0014 (2013.01); H04L 2027/0053 (2013.01); H04L 2027/0069 (2013.01)

(58) Field of Classification Search
CPC ..... H04L 7/033; H04L 7/0337; H04L 7/0338; H04L 7/0331; H03L 7/0814; H03L 7/0338; H03L 7/0331; H03L 7/0896; H03L 7/087; H03L 7/0891; H03L 7/095; H03L 7/091; H03L 7/093; H03L 7/18; H03L 7/0812; H03L 7/07; H03L 7/0893; H03L 7/00; H03L 7/08; H03L 7/081; H03L 7/0996; H03L 7/1974; H03L 7/0337; G06F 1/10; G01B 7/00; G01D 5/24404; G01R 29/02
USPC ......... 375/219, 295, 316, 354, 371, 373–376; 327/144–148, 155–157
See application file for complete search history.

(56) References Cited

U.S. PATENT DOCUMENTS

| 7,049,852 B2 | 5/2006 | Melanson |
| 7,349,516 B2 * | 3/2008 | Hammes et al. ............... 375/376 |
| 7,362,835 B2 * | 4/2008 | Chen ............................ 375/354 |
| 7,911,241 B1 * | 3/2011 | Zeller ............................ 327/105 |

(Continued)

FOREIGN PATENT DOCUMENTS

KR 1020070021426 2/2007

*Primary Examiner* — Tesfaldet Bocure
(74) *Attorney, Agent, or Firm* — F. Chau & Associates, LLC

(57) ABSTRACT

A fractional-N phase locked loop is provided. The fractional-N phase locked loop includes a phase adjusting circuit detecting a phase difference between a reference clock signal and a feedback clock signal and outputting a plurality of phase clock signals in response to the detected phase difference, a phase selector selecting and outputting one of the plurality of phase clock signals output from the phase adjusting circuit in response to a phase selection signal, a control circuit generating the phase selection signal by using a sigma-delta modulator operation clock signal, which is generated by dividing the selected phase clock signal by each of N or more different integers (N is an integer more than or equal to 2), and a first divider generating the feedback clock signal by dividing the selected phase clock signal by an integer.

11 Claims, 8 Drawing Sheets

(56) References Cited

U.S. PATENT DOCUMENTS

| | | | |
|---|---|---|---|
| 2004/0247027 A1* | 12/2004 | Wang | 375/239 |
| 2006/0030285 A1* | 2/2006 | Ghazali et al. | 455/260 |
| 2006/0176940 A1* | 8/2006 | Chen | 375/150 |
| 2007/0121773 A1 | 5/2007 | Kuan et al. | |
| 2009/0015338 A1* | 1/2009 | Frey | 331/16 |
| 2009/0083567 A1* | 3/2009 | Kim et al. | 713/501 |
| 2009/0140782 A1 | 6/2009 | Huang et al. | |
| 2009/0160493 A1* | 6/2009 | You et al. | 327/105 |
| 2009/0212835 A1* | 8/2009 | Xu et al. | 327/156 |
| 2009/0221235 A1* | 9/2009 | Ciccarelli et al. | 455/62 |
| 2011/0156773 A1* | 6/2011 | Beccue | 327/156 |

* cited by examiner

FRACTIONAL-N PHASE LOCKED LOOP, OPERATION METHOD THEREOF, AND DEVICES HAVING THE SAME

CROSS-REFERENCE TO RELATED APPLICATIONS

This application claims priority under 35 U.S.C. §119(a) from Korean Patent Application No. 10-2010-0088202 filed on Sep. 9, 2010, the disclosure of which is incorporated by reference in its entirety herein.

BACKGROUND

Embodiments of the present inventive concept are directed to a phase locked loop, and more particularly, to a fractional-N phase locked loop with a wide frequency synthesis range, an operation method of the fractional-N locked loop, and devices having the fractional-N locked loop.

A phase locked loop is used to generate a signal having a stable frequency and to vary a frequency. To maintain a stable frequency, the phase locked loop should have minimum jitter.

SUMMARY

The exemplary embodiments of the present general inventive concept provide a fractional-N phase locked loop which may generate an exact phase clock signal with a wide frequency synthesis range, an operation method of the fractional-N phase locked loop, and devices having the fractional-N phase locked loop.

An embodiment of the present invention is directed to a fractional-N phase locked loop, including a phase adjusting circuit detecting a phase difference between a reference clock signal and a feedback clock signal and outputting a plurality of phase clock signals in response to the detected phase difference, a phase selector selecting and outputting one of the plurality of phase clock signals outputted from the phase adjusting circuit in response to a phase selection signal, a control signal generating the phase selection signal by using a sigma-delta modulator operation clock signal, which is generated by dividing the selected phase clock signal by each of N or more different integers (N is an integer greater than or equal to 2) successively, and a first divider generating the feedback clock signal by dividing the selected phase clock signal by an integer.

The phase adjusting circuit includes the phase frequency detector detecting a phase difference between the reference clock signal and the feedback clock signal and generating a phase detection signal corresponding to the detected phase difference, a charge pump outputting or receiving a current according to the phase detection signal, a loop filter increasing or decreasing a voltage according to the current, and a multi-phase voltage controlled oscillator outputting the plurality of phase clock signals according to the voltage.

The control circuit includes a second divider generating the sigma-delta modulator operation clock signal by dividing the selected phase clock signal by each of two different integers in response to a division control signal when N is 2, a first sigma-delta modulator operating in response to the sigma-delta modulator operation clock signal and generating a phase adjuster input signal according to a first sigma-delta modulator input signal and a plurality of predetermined threshold signals, a phase adjuster generating the phase selection signal according to the phase adjuster input signal, and a second sigma-delta modulator operating in response to the sigma-delta modulator operation clock signal and generating the division control signal according to a second sigma-delta modulator input signal and a predetermined threshold signal.

The division control signal is data '0' or data '1', and an output frequency of the data '0' and the data '1' is determined according to the predetermined threshold signal of the second sigma-delta modulator.

According to an exemplary embodiment, the second divider may be a dual modulus divider. According to an exemplary embodiment, the second sigma-delta modulator may be a first-order sigma-delta modulator.

An exemplary embodiment of the present invention is directed to a wireless communication device, including the fractional-N phase locked loop, a transmitter performing a transmission operation in response to a signal output from the fractional-N phase locked loop, a receiver performing a receiving operation in response to a signal output from the fractional-N phase locked loop, and a processor controlling an operation of the transmitter and the receiver.

An exemplary embodiment of the present invention is directed to an operation method of a fractional-N phase locked loop, including detecting a phase difference between a reference clock signal and a feedback clock signal and outputting a plurality of phase clock signals in response to the detected phase difference, selecting and outputting one of a plurality of phase clock signals in response to a phase selection signal, generating the phase selection signal by using a sigma-delta modulator operation clock signal generated by dividing the selected phase clock signal by each of N or more different integers (N is an integer more than or equal to 2), and generating the feedback clock signal by dividing the selected phase clock signal by an integer.

Outputting the plurality of phase clock signals includes detecting the phase difference between the reference clock signal and the feedback clock signal and generating a phase detection signal corresponding to the detected phase difference, sourcing a current to an output terminal or sinking a current from the output terminal according to the phase detection signal, increasing or decreasing a voltage according to the current, and outputting the plurality of phase clock signals according to the voltage.

Generating the phase selection signal includes generating the sigma-delta modulator operation clock signal by dividing the selected phase clock signal by each of two different integers in response to a division control signal when N is 2, generating a phase adjuster input signal according to a first sigma-delta modulator input signal and a plurality of predetermined threshold signals while operating in response to the sigma-delta modulator operation clock signal, generating the phase selection signal according to the phase adjuster input signal, and generating the division control signal according to a second sigma-delta modulator input signal and a predetermined threshold signal while operating in response to the sigma-delta modulator operation clock signal.

The division control signal is a data '0' or a data '1', and an output frequency of the data '0' and a data '1' is determined according to the predetermined threshold signal of the second sigma-delta modulator.

According to an exemplary embodiment of the inventive concept, there is provided a fractional-N phase locked loop comprising a phase adjusting circuit configured to output a plurality of phase clock signals based on a comparison between a reference clock signal and a feedback clock signal, a phase selector configured to select one of the plurality of phase clock signals in response to a phase selection signal, a first divider configured to divide the selected phase clock signal by a first division ratio and to generate the feedback clock signal, and a second divider configured to divide the selected phase clock signal by a second division ratio and to generate a sigma-delta modulator operation clock signal, wherein the first division ratio has a constant value with respect to the second division ratio, and wherein the phase selection signal is generated based on the sigma-delta modulator operation clock signal.

According to an embodiment, the fractional-N phase locked loop further comprises a sigma-delta modulator configured to operate in response to the sigma-delta modulator operation clock signal and to generate a division control signal according to a predetermined sigma-delta modulator input signal and a predetermined threshold signal, wherein the second divider divides the selected phase clock signal in response to the division control signal.

BRIEF DESCRIPTION OF THE DRAWINGS

The embodiments of the present general inventive concept will become apparent and more readily appreciated from the following description of the embodiments, taken in conjunction with the accompanying drawings of which.

DETAILED DESCRIPTION OF EMBODIMENTS

Figure 1:
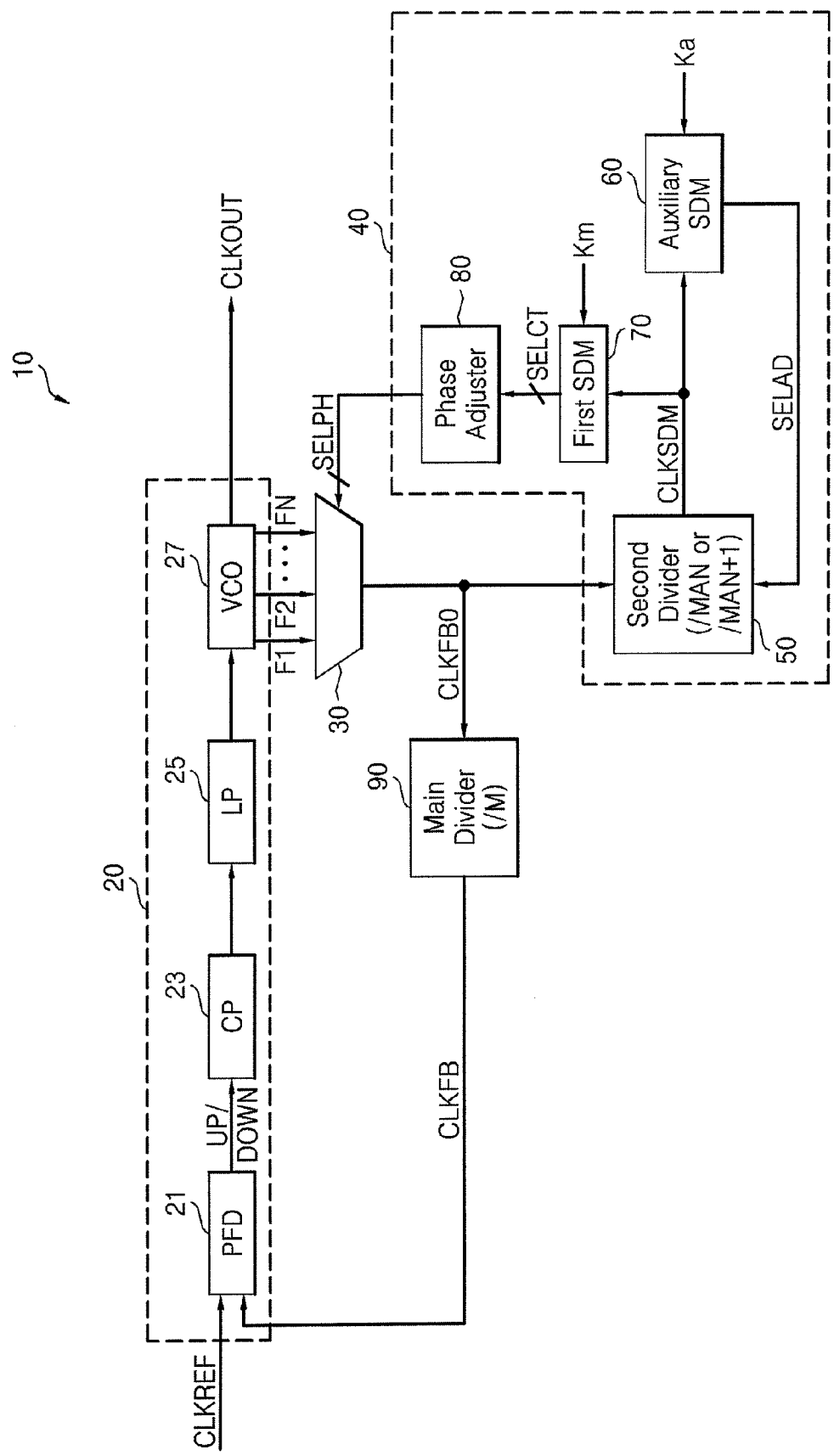
FIG. 1 is a block diagram illustrating a fractional-N phase locked loop according to an exemplary embodiment of the present invention.

Reference will now be made in detail to the embodiments of the present general inventive concept, examples of which are illustrated in the accompanying drawings, wherein like reference numerals may refer to the like or similar elements throughout the specification and the drawings. FIG. 1 shows a block diagram of a fractional-N phase locked loop according to an exemplary embodiment of the present invention. Referring to FIG. 1, a fractional-N phase locked loop 10 includes a phase adjusting circuit 20, a phase selector 30, a control circuit 40, and a first divider 90.

The phase adjusting circuit 20 detects a phase difference between a reference clock signal CLKREF and a feedback clock signal CLKFB and outputs a plurality of phase clock signals F1, F2, . . . , and FN in response to a detected difference.

The phase adjusting circuit 20 includes a phase frequency detector 21, a charge pump 23, a loop filter 25, and a multi-phase voltage controlled oscillator 27.

The phase frequency detector 21 detects a phase difference between the reference clock signal CLKREF and the feedback clock signal CLKFB and generates a phase detection signal UP or DOWN corresponding to the detected difference. For example, when a phase of the feedback clock signal CLKFB lags behind a phase of the reference clock signal CLKREF, the phase frequency detector 21 outputs a first phase detection signal UP. However, when a phase of the feedback clock signal CLKFB leads a phase of the reference clock signal CLKREF, the phase frequency detector 21 outputs a second phase detection signal DOWN.

The charge pump 23 sources a current output from a power supply to an output terminal or sinks a current from the output terminal to a ground in response to the phase detection signal UP or DOWN.

When the phase frequency detector 21 outputs the first phase detection signal UP (also referred to as "up control signal"), the charge pump 23 sources a current output from the power supply to the loop filter 25, and when the phase frequency detector 21 outputs the second phase detection signal DOWN (also referred to as "down control signal"), the charge pump 23 sinks a current from the loop filter 25 to the ground.

The loop filter 25 increases an output voltage according to a sourced current or decreases the output voltage according to a sunk current. For example, the loop filter 25 generates a voltage varying according to a sourced or sunk current. The loop filter 25 eliminates jitter by removing a glitch from a current output from the charge pump 23 and by preventing voltage over-shoot.

According to an exemplary embodiment, the charge pump 23 may include the loop filter 25. According to an embodiment, the charge pump 23 may output a voltage varying in response to the phase detection signal UP or DOWN.

The multi-phase voltage controlled oscillator (VCO) 27 outputs a plurality of phase clock signals F1, F2, . . . , and FN according to a voltage output from the loop filter 25. For example, according to an embodiment, the multi-phase voltage controlled oscillator 27 may be a ring oscillator. The plurality of phase clock signals F1, F2, . . . , and FN have the same amplitude and different phases.

When the phase frequency detector 21 outputs the up control signal UP, the multi-phase voltage controlled oscillator 27 outputs a plurality of phase clock signals F1, F2, . . . , and FN each having a high frequency, and when the phase frequency detector 21 outputs the down control signal DOWN, the multi-phase voltage controlled oscillator 27 outputs a plurality of phase clock signals F1, F2, . . . , and FN each having a low frequency.

The phase selector 30 selects and outputs one of the plurality of phase clock signals F1, F2, . . . , and FN as a phase clock signal CLKFB0 in response to a phase selection signal SELPH. According to an embodiment, the phase selection signal SELPH may be a multi-bit digital signal. A frequency synthesis of an output clock signal CLKOUT is performed according to a result of multiplying a frequency of the reference clock signal CLKREF by a fraction. An integer part of the fraction is calculated by the first divider 90 and a decimal part is calculated by a phase selector 30.

The control circuit 40 generates the phase selection signal SELPH by using a sigma-delta modulator operation clock signal CLKSDM, which is generated by sequentially dividing the phase clock signal CLKFB0 output from the phase selector 30 by each of N or more different integers (N is equal to or more than 2).

The control circuit 40 includes a second divider 50, a second sigma-delta modulator 60, a first sigma-delta modulator 70, and a phase adjuster 80.

When N is 2, the second divider 50 generates a sigma-delta modulator operation clock signal CLKSDM by sequentially dividing a phase clock signal CLKFB0 by each of two different integers in response to a division control signal SELAD. According to an exemplary embodiment, the second divider 50 may include a dual modulus divider.

The second sigma-delta modulator 60 operates in response to the sigma-delta modulator operation clock signal CLKSDM and generates the division control signal SELAD according to a second sigma-delta modulator input signal Ka and a predetermined threshold signal.

According to an embodiment, the second sigma-delta modulator 60 may include a first-order sigma-delta modulator, or a second order or more sigma-delta modulator. The second sigma-delta modulator 60 is also referred to as "auxiliary sigma-delta modulator (SDM)".

Figure 2:
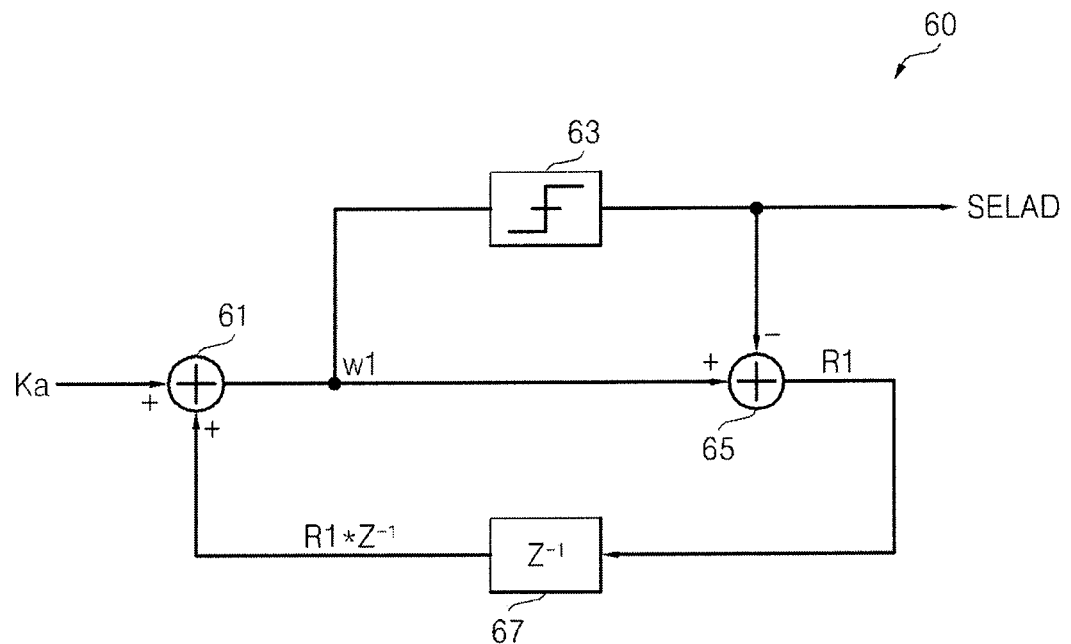
FIG. 2 is a block diagram of the second sigma-delta modulator illustrated in FIG. 1.

FIG. 2 shows a block diagram of the second sigma-delta modulator illustrated in FIG. 1. Referring to FIGS. 1 and 2, the second sigma-delta modulator 60 includes an adder 61, a quantizer 63, a reset circuit 65, and a feedback circuit 67.

The adder 61 adds the second sigma-delta modulator input signal Ka to a feedback signal $R1*Z^{-1}$ and outputs an additional signal w1. The quantizer 63 compares the additional signal w1 output from the adder 61 with a predetermined threshold signal. According to an exemplary embodiment, the quantizer 63 may include a comparator.

When a level of the additional signal w1 exceeds a level of the predetermined threshold signal, the quantizer 63 generates a carry and outputs data '1'. However, when the level of the additional signal w1 does not exceed the level of the predetermined threshold signal, the quantizer 63 outputs data '0'. When the quantizer 63 generates the carry, a reset circuit 65 resets the additional signal w1 output from the adder 61. The feedback circuit 67 outputs the feedback signal $R1*Z^{-1}$ by multiplying a signal R1 output from the reset circuit 65 by a feedback gain $Z^{-1}$.

Table 1 represents a state of each signal of the second sigma-delta modulator 60 when the second sigma-delta modulator input signal Ka is 1 and a level of a predetermined threshold signal is 4. According to an exemplary embodiment, the level of the second sigma-delta modulator input signal Ka or the level of the predetermined threshold signal may be changed.

TABLE 1

| CLKSDM | 0 | 1 | 2 | 3 | 4 | 5 | 6 | 7 | 8 | 9 |
|---|---|---|---|---|---|---|---|---|---|---|
| Ka | 1 | 1 | 1 | 1 | 1 | 1 | 1 | 1 | 1 | 1 |
| w1 | 1 | 2 | 3 | 0 | 1 | 2 | 3 | 0 | 1 | 2 |
| R1*Z-1 | 0 | 1 | 2 | 3 | 0 | 1 | 2 | 3 | 0 | 1 |
| SELAD | 0 | 0 | 0 | 1 | 0 | 0 | 0 | 1 | 0 | 0 |

Referring to table 1, when an additional signal w1 exceeds a level of the predetermined threshold signal, for example, "4", a carry is generated and the division control signal SELAD has data '1'. Accordingly, the division control signal SELAD has three "0"s and has a "1". For example, the second sigma-delta modulator 60 outputs the division control signal SELAD having data '1' with a probability of 0.25.

When the second sigma-delta modulator input signal Ka is smaller than 1, a probability of the division control signal SELAD having data '1' increases, and when the second sigma-delta modulator input signal Ka is greater than 1, the probability of the division control signal SELAD having data '1' decreases. For example, the second sigma-delta modulator 60 determines an output frequency of data '0' and '1' according to the predetermined threshold signal.

When N is 2, the second divider 50 generates the sigma-delta modulator operation clock signal CLKSDM by sequentially dividing the phase clock signal CLKFB0 by each of two different integers in response to the division control signal SELAD.

For example, assuming that the two different integers are 3 and 4, when the division control signal SELAD has data '0', the second divider 50 divides the phase clock signal CLKFB0 by a division ratio of 3 in response to the division control signal SELAD having data '0', and when the division control signal SELAD has data '1', the second divider 50 divides the phase clock signal CLKFB0 by a division ratio of 4 in response to the division control signal SELAD having data '1'. Since the probability of outputting data '1' as the division control signal SELAD is 0.25, the second divider 50 generates the sigma-delta modulator operation clock signal CLKSDM by dividing the phase clock signal CLKFB0 by a division ratio of 3 three times and by a division ratio of 4 once.

Figure 3:
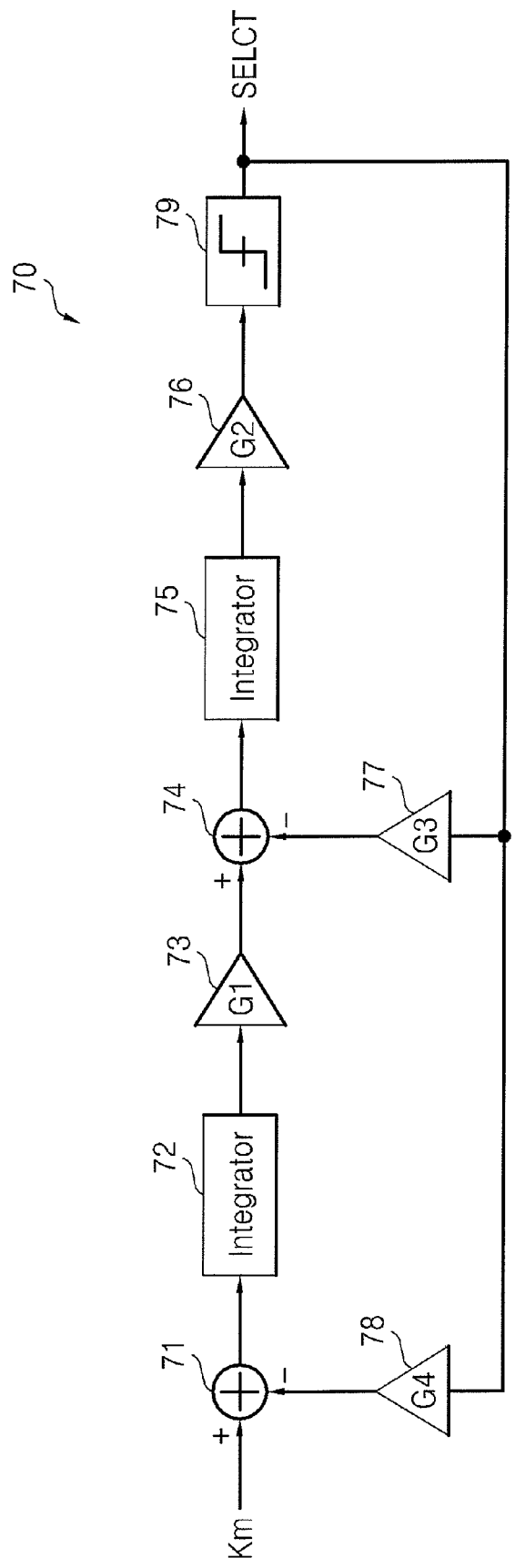
FIG. 3 is a block diagram of the first sigma-delta modulator illustrated in FIG. 1.

FIG. 3 shows a block diagram of the first sigma-delta modulator illustrated in FIG. 1. Referring to FIGS. 1 and 3, the first sigma-delta modulator 70 operates in response to the signal-delta modulator operation clock signal CLKSDM, and generates the phase adjuster input signal SELCT according to a first sigma-delta modulator input signal Km and a plurality of predetermined threshold signals. The first sigma-delta modulator 70 of FIG. 3 is a second order sigma-delta modulator. According to an exemplary embodiment, the first sigma-delta modulator 70 may include a second order or more sigma-delta modulator.

The first sigma-delta modulator 70 includes a plurality of subtractors 71 and 74, a plurality of scaling blocks 73, 76, 77, and 78, a plurality of integrators 72 and 75, and a quantizer 79.

According to an embodiment, each of the plurality of scaling blocks 73, 76, 77, and 78 may amplify or attenuate an input signal. Respective gains G1, G2, G3, and G4 of the plurality of scaling blocks 73, 76, 77, and 78 each have a value between 0 and 1.

The first subtractor 71 subtracts an output signal of the fourth scaling block 78 from the first sigma-delta modulator input signal Km and outputs a subtraction result to the first integrator 72. The first integrator 72 integrates a subtraction result.

The first scaling block 73 amplifies the signal integrated by the first integrator 72 according to the amplification gain G1, and a second subtractor 74 subtracts an output signal of a third scaling block 77 from an output signal of the first scaling block 73. The second integrator 75 integrates a subtraction result. The second scaling block 76 amplifies the signal integrated by the second integrator 75 according to the amplification gain G2, and the quantizer 79 generates a phase adjuster input signal SELCT by comparing the signal amplified by the second scaling block 76 with each of a predetermined plurality of threshold signals. According to an embodiment, the quantizer 79 may have three-levels. The plurality of threshold signals include a first threshold signal and a second threshold signal.

When a level of an input signal of the quantizer 79 is lower than a level of the first threshold signal, the first sigma-delta modulator 70 outputs a phase adjuster input signal SELCT which is '00'. When a level of an input signal of the quantizer 79 is between a level of the first threshold signal and a level of the second threshold signal, the sigma-delta modulator 70 outputs a phase adjuster input signal SELCT which is '01'.

When a level of an input signal of the quantizer 79 is higher than a level of the second threshold signal, the first sigma-delta modulator 70 outputs a phase adjuster input signal SELCT which is '11'. The phase adjuster 80 generates the phase selection signal SELPH according to the phase adjuster input signal SELCT.

When the phase adjuster input signal SELCT is '01', the phase adjuster 80 increases the phase selection signal SELPH, when the phase adjuster input signal SELCT is '00', the phase adjuster 80 maintains the phase selection signal SELPH as is, and when the phase adjuster input signal SELCT is '10', the phase adjuster 80 decreases the phase selection signal SELPH. According to an exemplary embodiment, an operation of the phase adjuster 80 and a phase selection signal may be changed according to the phase adjuster input signal SELCT.

The first divider 90 divides the phase clock signal CLKFB0 by an integer, e.g., M, and generates the feedback clock signal CLKFB. The first divider 90 is also referred to as a main divider.

When the fractional-N phase locked loop 10 is locked, a phase of the reference clock signal CLKREF is the same as a phase of the feedback clock signal CLKFB, and a frequency of the phase clock signal CLKFB0 is M times of a frequency of the feedback clock signal CLKFB. When the second sigma-delta modulator 60 is not included in the control circuit 40 and a frequency of the sigma-delta modulator operation clock signal CLKSDM is a value obtained by dividing the frequency of a phase clock signal CLKFB0 by any integer MA, a frequency of the sigma-delta modulator operation clock signal CLKSDM is as in Equation 1:

$$FSDM = Fref * M/MA \qquad \text{[Equation 1]}$$

Here, FSDM indicates a frequency of the sigma-delta modulator operation clock signal CLKSDM, Fref indicates a frequency of the reference clock signal CLKREF, M indicates a division ratio of the first divider 90, and MA indicates a division ratio when the second divider 50 is assumed to divide a frequency of the phase clock signal CLKFB0 by an integer.

A frequency of the output clock signal CLKOUT of the fractional-N phase locked loop 10 is as in Equation 2:

$$Fclkout = Fref * (M + (M*Km)/(MA*LC*N)) \qquad \text{[Equation 2]}$$

Here, Fclkout represents a frequency of the output clock signal CLKOUT, Km represents an input signal of the first sigma-delta modulator 70, LC represents a threshold signal of the first sigma-delta modulator 70, and N represents the number of a plurality of phases generated by the multi-phase voltage controlled oscillator 27.

Although the division ratio MA of the second divider 50 is set to a fixed value, an operation frequency, for example, FSDM/Fref, is not constant but changes according to the division ratio M of the first divider 90 whenever the phase frequency detector 21 operates. As the input signal of the first sigma-delta modulator 70, for example, the first sigma-delta modulator input signal Km, changes, a frequency variation ΔFclkout of the output clock signal CLKOUT changes correspondingly. For example, when the input signal Km of the first sigma-delta modulator 70 changes as much as 1, the frequency variation ΔFclkout of the output clock signal CLKOUT is as in Equation 3:

$$\Delta Fclkout = (Fref*M)/(MA*N*LC) \qquad \text{[Equation 3]}$$

Referring to FIG. 3, as the division ratio M of the first divider 90 and the division ratio MA of the second divider 50 change, the frequency variation ΔFclkout of an output clock signal CLKOUT varies correspondingly. As a consequence, a minimum unit that may synthesize a frequency necessary for generating the output clock signal CLKOUT may be changed.

If the division ratio M of the first divider 90 has a constant value with respect to the division ratio MA of the second divider 50, the above-mentioned change in the frequency variation ΔFclkout or change in the minimum unit may be removed. When the division ratio M of the first divider 90 has a fixed value of R with respect to the division ratio MA of the second divider 50, this may be represented as in Equation 4:

$$M/MA = R \qquad \text{[Equation 4]}$$

A frequency of the output clock signal CLKOUT of the fractional-N phase locked loop 10 is represented as in Equation 5:

$$Fclkout = Fref * (M + R*Km)/(LC*N) \qquad \text{[Equation 5]}$$

When M and R are set to any values, the division ratio MA of the second divider 50 is represented as in Equation 6:

$$MA = M/R = MAN + MAF \qquad \text{[Equation 6]}$$

The division ratio MA of the second divider 50 includes an integer division ratio MAN and a decimal division ratio MAF. To obtain the division ratio MA of the second divider 50 including the integer division ratio MAN and the decimal division ratio MAF, the second sigma-delta modulator 60 is provided as illustrated in FIG. 1. By using the second sigma-delta modulator 60, the change in the frequency variation ΔFclkout or change in the minimum unit, may be removed.

Figure 4:
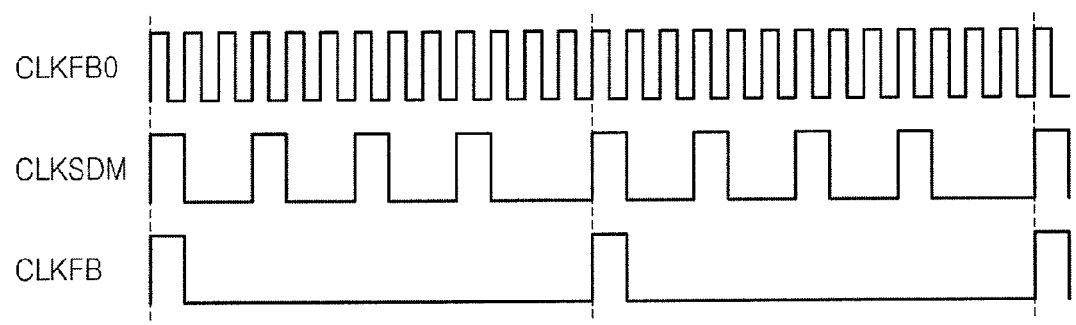
FIG. 4 is a timing diagram for describing an operation of a fractional-N phase locked loop according to an exemplary embodiment of the present invention.

FIG. 4 is a timing diagram for describing an operation of a fractional-N phase locked loop according to an exemplary embodiment of the present invention. FIG. 4 illustrates waveforms of the phase clock signal CLKFB0, sigma-delta modulator operation clock signal CLKSDM, and feedback clock signal CLKFB when the division ratio M of the first divider 90 is 13 and the division ratio M of the first divider 90 with respect to the division ratio MA of the second divider 50, for example R, is 4.

Referring to FIGS. 1 to 4, since the first divider 90 generates the feedback clock signal CLKFB by dividing a phase clock signal CLKFB0 by 13, a frequency of the phase clock signal CLKFB0 is thirteen times greater than a frequency of the feedback clock signal CLKFB.

The division control signal SELAD has one "1" for every three "0's". For example, the second sigma-delta modulator 60 outputs the division control signal SELAD having data '1' with a probability of 0.25.

The second divider 50 generates the sigma-delta modulator operation clock signal CLKSDM by dividing the phase clock signal CLKFB0 by each of 3 and 4 in response to the division control signal SELAD.

The sigma-delta modulator operation clock signal CLKSDM has inconsistent frequencies. However, the phase frequency detector 21 detects a phase difference between the reference clock signal CLKREF and the feedback clock signal CLKFB, and generates a phase detection signal corresponding to the detected phase difference. Since only the phase difference is concerned with frequency synthesis, it is not important that the sigma-delta modulator operation clock signal CLKSDM has inconsistent frequencies.

Accordingly, when a total sum of phase shifts of the sigma-delta modulator operation clock signal CLKSDM is consistent whenever the phase frequency detector 21 operates, the fractional-N phase locked loop 10 displays the same result as an operation of a phase locked loop using the sigma-delta modulator operation clock signal CLKSDM having an equal frequency.

The above relation is always applied to a case where the sigma-delta modulator operation clock signal CLKSDM is an integer multiple of the reference clock signal CLKREF.

When the number of a plurality of phase clock signals F1, F2, . . . , and FN output by the multi-phase voltage controlled oscillator 27 is N, the fractional-N phase locked loop 10 may generate the plurality of phase clock signals F1, F2, . . . , and FN regardless of a frequency synthesis region when a frequency FSDM of the sigma-delta modulator operation clock signal CLKSDM becomes Fref*N/2, where Fref is a frequency of the reference clock signal CLKREF. This is because the phase adjuster 80 may generate a fractional value between −0.5 and 0.5.

Figure 5:
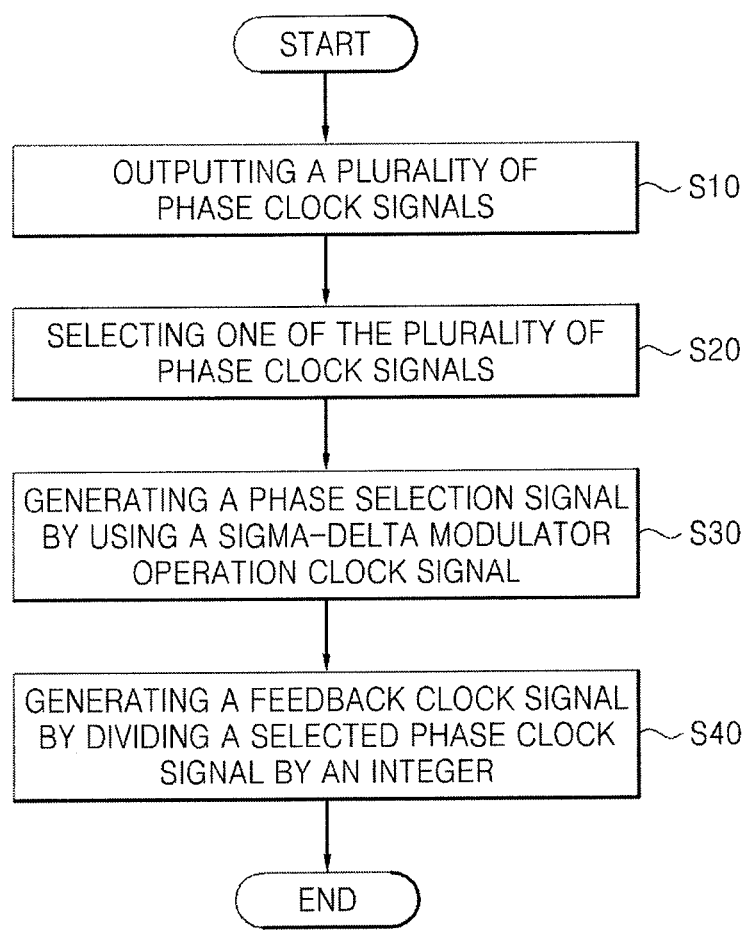
FIG. 5 is a flowchart for describing an algorism of a fractional-N phase locked loop according to an exemplary embodiment of the present invention.

FIG. 5 is a flowchart for describing an algorism of a fractional-N phase locked loop according to an exemplary embodiment of the present invention. Referring to FIGS. 1 to 5, the phase adjusting circuit 20 detects a phase difference between the reference clock signal CLKREF and the feedback clock signal CLKFB and outputs the plurality of phase clock signals F1, F2, . . . , and FN in response to the detected phase difference (S10).

The phase selector 30 outputs one of the plurality of phase clock signals F1, F2, . . . , and FN as the phase clock signal CLKFB0 in response to the phase selection signal SELPH (S20). The control circuit 40 generates the phase selection signal SELPH by using the sigma-delta modulator operation clock signal CLKSDM, which is generated by dividing the phase clock signal CLKFB0 output from the phase selector 30 by each of N or more different integers (N is more than or equal to 2) (S30). The first divider 90 generates the feedback clock signal CLKFB by dividing the phase clock signal CLKFB0 by an integer (S40).

Figure 6:
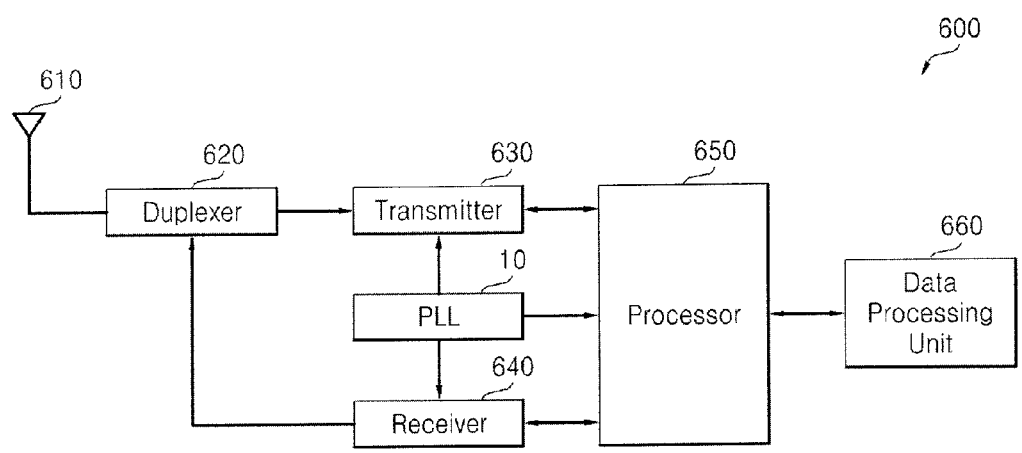
FIG. 6 is a block diagram showing an exemplary wireless communication device including the fractional-N phase locked loop illustrated in FIG. 1.

FIG. 6 is a block diagram illustrating an exemplary wireless communication device including the fractional-N phase locked loop illustrated in FIG. 1. Referring to FIG. 6, a wireless communication device 600 may be a security system, a set-top box, a mobile communication device, an information technology device (IT), or a computer system including a wireless communication device.

The wireless communication device 600 includes an antenna 610, a duplexer 620, a transmitter 630, a receiver 640, a fractional-N phase locked loop 10, and a processor 650. According to an embodiment, the wireless communication device 600 may include other hardware components. The duplexer 620 transmits or receives a radio frequency (RF) signal through the antenna 610.

The transmitter 630 receives a data signal having actual information, such as, e.g., voice or image data, converts the received data signal into a radio frequency (RF) signal and outputs the converted radio frequency (RF) signal. The receiver 640 receives a radio frequency (RF) signal, converts the received radio frequency signal RF into a data signal, and outputs the converted data signal. The transmitter 630 and the receiver 640 operate in response to a signal output from the fractional-N phase locked loop 10. The processor 650 controls an operation of the transmitter 630 or an operation of the receiver 640. According to an exemplary embodiment, the processor 650 may operate in response to a signal output from the fractional-N phase locked loop 10.

According to an embodiment, the wireless communication device 600 may further include a data processing unit 660. According to an embodiment, the data processing unit 660 may include a display device or an input device. The processor 650 controls the data processing unit 660.

Figure 7:
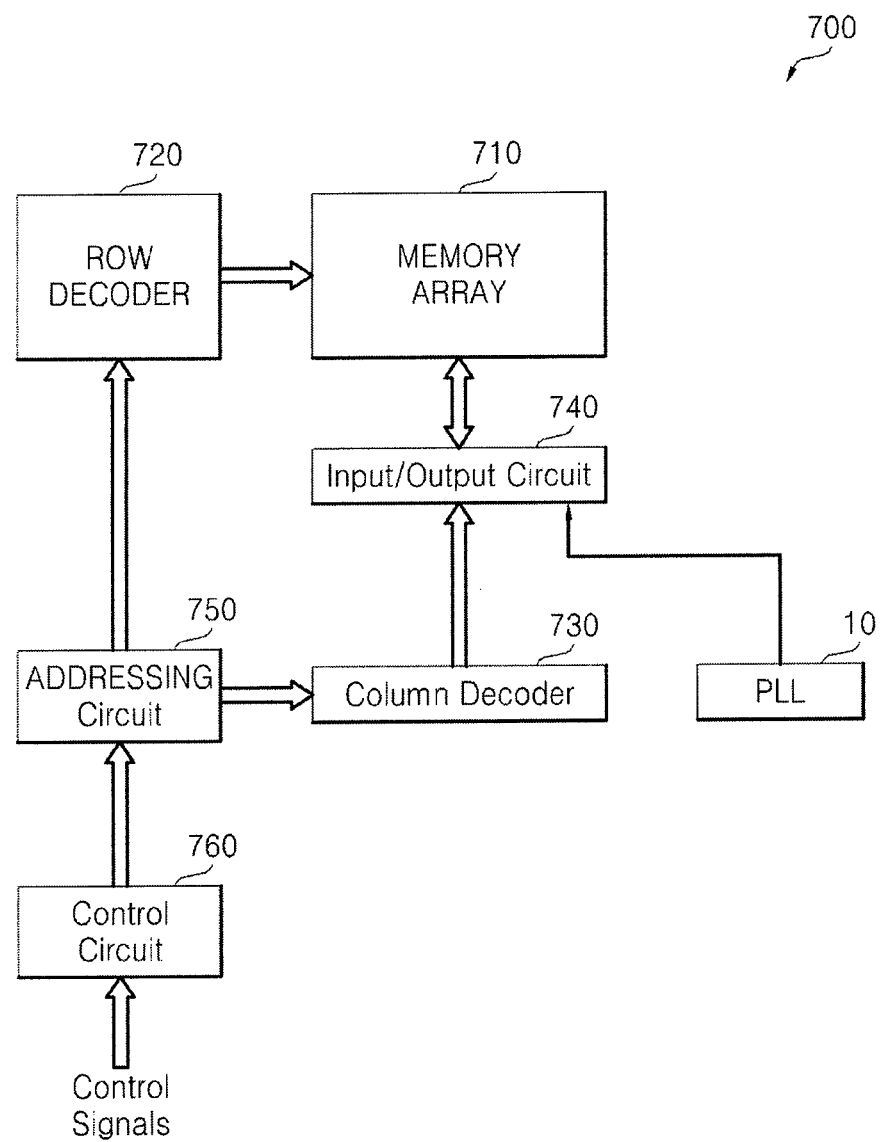
FIG. 7 is a block diagram showing an exemplary semiconductor device including the fractional-N phase locked loop illustrated in FIG. 1.

FIG. 7 is a block diagram illustrating an exemplary semiconductor device including the fractional-N phase locked loop illustrated in FIG. 1. Referring to FIG. 7, a semiconductor device 700 includes a fractional-N phase locked loop 10, a memory array 710, a row decoder 720, a column decoder 730, an input/output circuit 740, an addressing circuit 750, and a control circuit 760.

The memory array 710 includes a plurality of word lines, a plurality of bit lines, and a plurality of memory cells connected between the plurality of word lines and the plurality of bit lines. According to an embodiment, each of the plurality of memory cells may include a volatile memory cell, such as a dynamic random access memory (DRAM) or a static RAM (SDRAM).

According to an embodiment, each of the plurality of memory cells may include a non-volatile memory device, such as, for example, an Electrically Erasable Programmable Read-Only Memory (EEPROM), a flash memory, a Magnetic RAM (MRAM), a Spin-Transfer Torque MRAM, a Conductive bridging RAM (CBRAM), a Ferroelectric RAM (Fe-RAM), a Phase change RAM (PRAM), a Resistive RAM (RRAM or ReRAM), a Nanotube RRAM, a Polymer RAM (PoRAM), a Nano Floating Gate Memory (NFGM), a holographic memory, a Molecular Electronics Memory Device, or an Insulator Resistance Change Memory. The non-volatile memory cell may store a bit of data or a plurality of bits of data.

The row decoder 720 receives a row address output from the addressing circuit 750 and selects one of the plurality of word lines by decoding the received row address.

The column decoder 730 receives a column address output from the addressing circuit 750 and selects one of the plurality of bit lines by decoding the received column address.

The input/output circuit 740 writes data on at least a memory cell selected by the row decoder 720 and the column decoder 730, or reads data from at least a memory cell selected by the row decoder 720 and the column decoder 730.

The input/output circuit 740 includes a plurality of sensing amplifiers for amplifying sensing of data to be read during a read operation and a plurality of drivers for driving data to be written during a write operation.

The addressing circuit 750 generates a row address and a column address under a control of a control circuit 760. The control circuit 760 generates a plurality of operation control signals controlling an operation of the addressing circuit 750 in response to a plurality of control signals required for performing a read operation or a write operation.

An output signal of the fractional-N phase locked loop 10 is transmitted to the input/output circuit 740.

Figure 8:
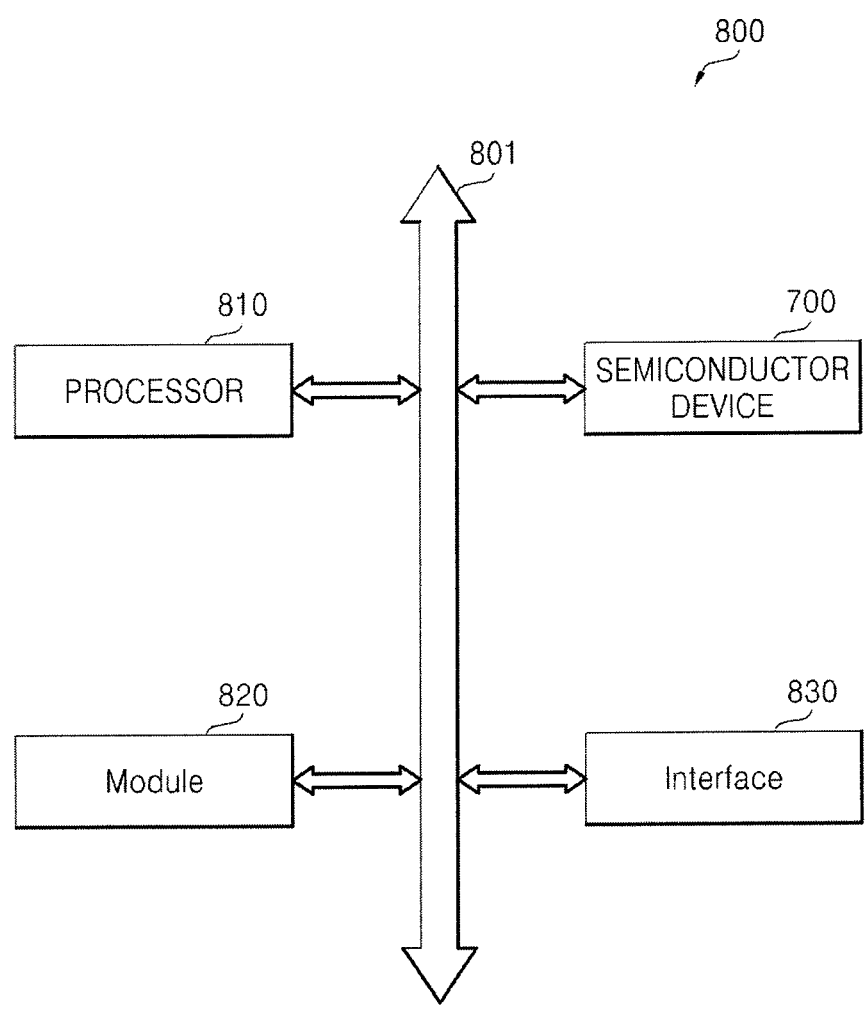
FIG. 8 is a block diagram of a semiconductor system including the semiconductor device illustrated in FIG. 7.

FIG. 8 is a block diagram illustrating a semiconductor system including the semiconductor device illustrated in FIG. 7. Referring to FIG. 8, according to embodiments, a semiconductor system 800 may be used in a PC, a portable computer, a portable mobile communication device, or consumer equipment (CE).

The portable mobile communication device includes a cellular phone, a personal digital assistant (PDA), a portable multimedia player (PMP). According to an embodiment, the semiconductor system 800 may be a memory card, an e-book, a game console, a game controller, a navigator, or an electronic musical instrument. According to an embodiment, the consumer equipment (CE) may be a digital TV, a home automation device, or a digital camera.

The semiconductor system 800 includes a semiconductor device 700 and a processor 810. The semiconductor device 700 and the processor 810 exchanges data through a bus 801. For example, according to an embodiment, the processor 810 may generally control a memory access operation of the semiconductor device 700.

According to an embodiment, the semiconductor system 800 may further include a module 820. According to an embodiment, the module 820 may be a wireless communication module. The module 820 transmits data stored in the semiconductor device 700 to an outside device (not shown) through wireless communication or store data transmitted from an outside device (not shown) in the semiconductor device 700 under a control of the processor 810. According to an exemplary embodiment, the module 820 may be an image sensor. The image sensor stores a digital signal generated by capturing an image in the semiconductor device 700 and transmit data stored in the semiconductor device 700 to an outside device (not shown) through the interface 830 under a control of the processor 810. According to an embodiment, the semiconductor system 800 may further include the interface 830.

According to an embodiment, the interface 830 may be a display device, an input device, such as a keyboard, a mouse, or a scanner, or an output device, such as a printer.

According to the embodiments of the present invention, the fractional-N phase locked loop may have a wide frequency synthesis region by using an auxiliary sigma-delta modulator and may generate an accurate phase clock signal.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A fractional-N phase locked loop comprising:
a phase adjusting circuit detecting a phase difference between a reference clock signal and a feedback clock signal and outputting a plurality of phase clock signals in response to the detected phase difference;
a phase selector selecting and outputting one of the plurality of phase clock signals output from the phase adjusting circuit in response to a phase selection signal;
a control circuit generating the phase selection signal by using a sigma-delta modulator operation clock signal generated by dividing the selected phase clock signal output from the phase selector by each of N or more different integers (N is an integer more than or equal to 2); and
a first divider generating the feedback clock signal by dividing the selected phase clock signal by an integer;
wherein the control circuit comprises:
a second divider generating the sigma-delta modulator operation clock signal by dividing the selected phrase clock signal by each of two different integers in response to a division control signal when N is 2;
a first sigma-delta modulator operating in response to the sigma-delta modulator Operation clock signal and generating a phase adjuster input signal according to a first sigma-delta modulator input signal and a plurality of predetermined threshold signals;
a phrase adjuster generating the phase selection signal according to the phase adjuster input signal; and
a second sigma-delta modulator operating in response to the sigma-delta modulators operation clock signal and generating the division control signal according to a second sigma-delta modulator input signal and a predetermined threshold signal.

2. The fractional-N phase locked loop of claim 1, wherein the phase adjusting circuit comprises:
a phase frequency detector detecting the phase difference between the reference clock signal and the feedback clock signal and generating a phase detection signal corresponding to the detected phase difference;
a charge pump sourcing a current to an output terminal or sinking a current from the output terminal according to the phase detection signal;
a loop filter increasing or decreasing a voltage according to the current; and
a multi-phase voltage controlled oscillator outputting the plurality of phase clock signals according to the voltage.

3. The fractional-N phase locked loop of claim 1, wherein the division control signal is data '0' or data '1', wherein an output frequency of the data '0' and the data '1' is determined according to the predetermined threshold signal of the second sigma delta modulator.

4. The fractional-N phase locked loop of claim 1, wherein the second divider is a dual modulus divider.

5. The fractional-N phase locked loop of claim 1, wherein the second sigma-delta modulator is a first order sigma-delta modulator.

6. A wireless communication device comprising:
a fractional-N phase locked loop;
a transmitter performing a transmission operation in response to a signal output from the fractional-N phase locked loop;
a receiver performing a receiving operation in response to a signal output from the fractional-N phase locked loop; and
a processor controlling an operation of the transmitter and the receiver,
wherein the fractional-N phase locked loop comprises:
a phase adjusting circuit detecting a phase difference between a reference clock signal and a feedback clock signal and outputting a plurality of phase clock signals in response to the detected phase difference;
a phase selector selecting and outputting one of the plurality of phase clock signals output from the phase adjusting circuit in response to a phase selection signal;
a control circuit operating by a sigma-delta modulator operation clock signal, which is generated by dividing the selected phase clock signal output from the phase selector by each of N or more different integers (N is an integer more than or equal to 2), and generating the phase selection signal; and
a first divider generating the feedback clock signal by dividing the selected phase clock signal by an integer;
wherein the control circuit comprises:
a second divider generating the sigma-delta modulator operation clock signal by dividing the selected phase clock signal by each of N or more different integers (N is an integer more than or equal to 2) in response to a division control signal when N is 2;
a first sigma-delta modulator operating in response to the sigma-delta modulator operation clock signal and generating a phase adjuster input signal according to a first sigma-delta modulator input signal and a plurality of predetermined threshold signals;
a phase adjuster generating the phase selection signal according to the phase adjuster input signal; and
a second sigma-delta modulator operating in response to the sigma-delta modulator operation clock signal and generating the division control signal according to a second sigma-delta modulator input signal and a predetermined threshold signal.

7. The wireless communication device of claim 6, wherein the phase adjusting circuit comprises:
a phase frequency detector detecting the phase difference between the reference dock signal and the feedback clock signal and generating a phase detection signal corresponding to the detected phase difference;
a charge pump sourcing a current to an output terminal or sinking a current from the output terminal;
a loop filter increasing or decreasing a voltage according to the current; and a multi-phase voltage controlled oscillator outputting the plurality of phase clock signals according to the voltage.

8. The wireless communication device of claim 6, wherein the division control signal is data '0' or data '1', wherein an output frequency of the data '0' and the data '1' is determined according to the predetermined threshold signal of the second sigma-delta modulator.

9. The wireless communication device of claim 6, wherein the second divider is a dual modulus divider.

10. The wireless communication device of claim 6, wherein the second sigma-delta modulator is a first-order sigma-delta modulator.

11. A fractional-N phase locked loop comprising:
a phase adjusting circuit configured to output a plurality of phase clock signals based on a comparison between a reference clock signal and a feedback clock signal;
a phase selector configured to select one of the plurality of phase clock signals in response to a phase selection signal;
a first divider configured to divide the selected phase clock signal by a first division ratio and to generate the feedback clock signal;
a second divider configured to divide the selected phase clock signal by a second division ratio and to generate a sigma-delta modulator operation clock signal, wherein the first division ratio has a constant value with respect to the second division ratio, and wherein the phase selection signal is generated based on the sigma-delta modulator operation clock signal; and
a sigma-delta modulator configured to operate in response to the sigma-delta modulator operation clock signal and to generate a division control signal according to a predetermined sigma-delta modulator input signal and a predetermined threshold signal, wherein the second divider divides the selected phase clock signal in response to the division control signal.

* * * * *